US005600179A

United States Patent [19]
Suzuki

[11] Patent Number: 5,600,179
[45] Date of Patent: Feb. 4, 1997

[54] PACKAGE FOR PACKAGING A SEMICONDUCTOR DEVICE SUITABLE FOR BEING CONNECTED TO A CONNECTION OBJECT BY SOLDERING

[75] Inventor: Katsunobu Suzuki, Tokyo, Japan

[73] Assignee: NEC Corporation, Tokyo, Japan

[21] Appl. No.: 534,316

[22] Filed: Sep. 27, 1995

[30] Foreign Application Priority Data

Sep. 27, 1994 [JP] Japan .................................... 6-231840

[51] Int. Cl.$^6$ ................................................. H01L 23/48
[52] U.S. Cl. .......................... 257/690; 257/696; 257/779
[58] Field of Search ................................. 257/690, 696, 257/779, 786, 692, 723, 712

[56] References Cited

U.S. PATENT DOCUMENTS 3,930,115 12/1975 Uden et al. .............................. 257/696
4,673,967 6/1987 Hingorany ............................... 257/696

FOREIGN PATENT DOCUMENTS 4-206658 7/1992 Japan .

Primary Examiner—Sara W. Crane
Assistant Examiner—Roy Potter
Attorney, Agent, or Firm—Sughrue, Mion, Zinn, Macpeak & Seas

[57] ABSTRACT

For packaging a semiconductor device, a metal plate is formed to include a central plate portion and a peripheral plate portion extending outwardly from the central plate portion. The central plate portion has a first surface for mounting the semiconductor device and has a second surface opposite to the first surface in a predetermined direction. The peripheral plate portion is bent to face the second surface of the central plate portion and extends substantially along a reference plane which is perpendicular to the predetermined direction. The peripheral plate portion has a particular portion projecting from the reference plane opposite the central plate portion. An insulator layer is deposited on the metal plate. In addition, a conductive pattern is formed on the insulator layer. The insulator layer extends along the metal plate from the first surface of the central plate portion to the peripheral plate portion to cover the particular portion. The conductive pattern extends along the insulator layer from the central plate portion to the particular portion.

17 Claims, 14 Drawing Sheets

PACKAGE FOR PACKAGING A SEMICONDUCTOR DEVICE SUITABLE FOR BEING CONNECTED TO A CONNECTION OBJECT BY SOLDERING

BACKGROUND OF THE INVENTION

This invention relates to a package for packaging a semiconductor device or chip and to a packaged semiconductor device in which the semiconductor device is packaged in the package.

Semiconductor devices are used in various electronic units or systems. Typically, a semiconductor device is connected to a connection object included in each of the electronic units. In connecting the semiconductor device to the connection object, use is made of a package for packaging the semiconductor device to protect it.

A conventional package is disclosed in Japanese Patent Prepublication (Kokai or Publication of Unexamined Patent Application) No. 206658/1992 by Hosono et al. As will later be described in detail in conjunction with the drawing, a conventional package comprises a metal plate, an insulator layer extending along the metal plate, and a plurality of conductive patterns each extending along the insulator layer and being connected to the semiconductor device that is packaged in the conventional package. The metal plate includes a central plate portion and a peripheral plate portion extending outwardly from the central plate portion. Together with the insulator layer and the conductive patterns, the peripheral plate portion is bent to have a flat surface extending substantially smooth and even. As a result, each of the conductive patterns has a flat portion which extends substantially flat on the flat surface of the peripheral plate portion.

The flat portion is connected to the connection object by soldering with the flat surface of the peripheral plate portion facing a principal surface of the connection object. During soldering, solder can extend along the principal surface of the connection object due to surface tension thereof form a short circuit between adjacent ones of the conductive patterns and to connect each of the conductive patterns with the peripheral plate portion of the metal plate. This is because the principal surface of the connection object is generally flat and parallel to the flat surface of the peripheral portion.

SUMMARY OF THE INVENTION

It is therefore an object of this invention to provide a package for packaging a semiconductor device or chip, which is suitable for being connected to a connection object by soldering.

It is another object of this invention to provide a package of the type described, which does not cause a solder to extend along the connection object after soldering.

It is still another object of this invention to provide a combination of the package and the semiconductor device packaged in the package.

It is yet another object of this invention to provide a method of manufacturing the package.

Other objects of this invention will become clear as the description proceeds.

According to an aspect of this invention, there is provided a package for packaging a semiconductor device. The package comprises a metal plate including a central plate portion and a peripheral plate portion extending outwardly from the central plate portion. The central plate portion has a first surface for mounting the semiconductor device and a second surface opposite to the first surface in a predetermined direction. The peripheral plate portion is bent to face the second surface of the central plate portion and extends substantially along a reference plane which is perpendicular to the predetermined direction. In the package, the peripheral plate portion has a particular portion projecting from the reference plane opposite the central plate portion. The package further comprises an insulator layer extending along the metal plate from the first surface of the central plate portion to the peripheral plate portion to cover the particular portion and a conductive pattern extending along the insulator layer from the central plate portion to the particular portion.

According to another aspect of this invention, there is provided a package for packaging a semiconductor device. The package comprises a metal plate including a central plate portion and four peripheral plate portions extending outwardly from the central plate portion. The central plate portion has a first surface for mounting the semiconductor device and a second surface opposite to the first surface in a predetermined direction. Each of the peripheral plate portions is bent to face the second surface of the central plate portion and extends substantially along a reference plane which is perpendicular to the predetermined direction. In the package, the peripheral plate portions have a plurality of particular portions projecting from the reference plane opposite the central plate portion. The package further comprises an insulator layer extending along the metal plate from the first surface of the central plate portion to the peripheral plate portions to cover the particular portions and a plurality of conductive patterns extending along the insulator layer from the central plate portion to the particular portions.

According to this invention, there is further provided a combination of a package and a semiconductor device packaged in the package. The package comprises a metal plate including a central plate portion and a peripheral plate portion extending outwardly from the central plate portion. The central plate portion has a first surface and a second surface opposite to the first surface in a predetermined direction. The peripheral plate portion is bent to face the second surface of the central plate portion and extends substantially along a reference plane which is perpendicular to the predetermined direction. In the package, the peripheral plate portion has a particular portion projecting from the reference plane opposite the central plate portion. The package further comprises an insulator layer extending along the metal plate from the first surface of the central plate portion to the peripheral plate portion to cover the particular portion, a conductive pattern extending along the insulator layer from the central plate portion to the particular portion, and a cap member fixed on the insulator layer to form a sealed space in cooperation with the central plate portion therebetween. The semiconductor device is fixed to the central plate portion in the sealed space and electrically connected to the conductive pattern.

According to this invention, there is further provided a method of manufacturing a package for packaging a semiconductor device. The method comprises the steps of preparing a sheet member comprising a metal plate member having a first and a second surface opposite to each other in a predetermined direction, an insulator layer covering the first surface of the metal plate, and a conductive film placed on the insulator layer. The method further comprises the steps of patterning the conductive film and the insulator layer to make a recess portion on the sheet member, partially deleting the conductive film to leave a part of the conductive plate as a conductive pattern extending along the insulator layer, and partially removing the metal plate and the insulator layer to make said metal plate member have a central plate portion and a plurality of peripheral plate portions extending outwardly from the central plate portion. The recess portion is placed at the central sheet portion. The conductive pattern is placed at least one of the peripheral plate portions. The method further comprises the steps of bending each of the peripheral plate portions so that the second surface has portions facing each other, the peripheral plate portions extending substantially along a reference plane which is perpendicular to the predetermined direction, and making each of the peripheral plate portions have a particular portion projecting from the reference plane opposite the central plate portion.

DESCRIPTION OF THE PREFERRED EMBODIMENTS

Figure 1:
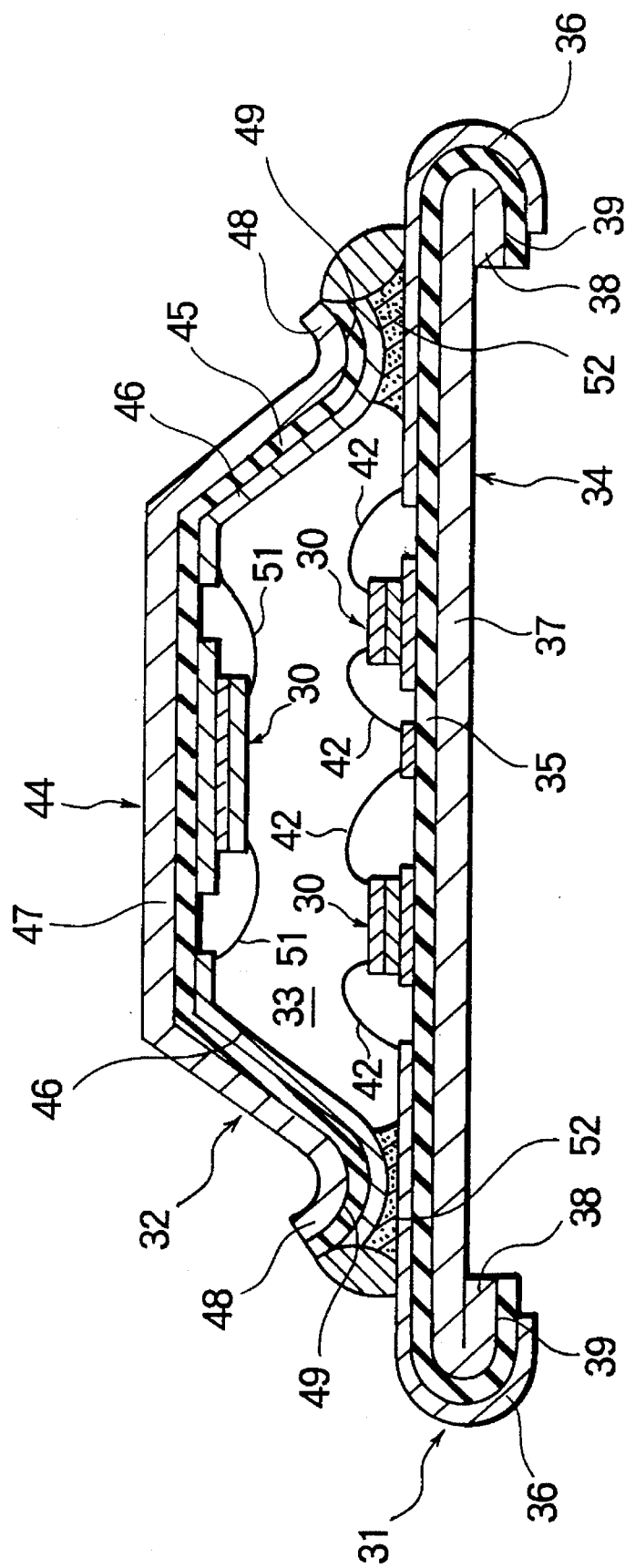
FIG. 1 is a sectional view of a conventional package for semiconductor devices or chips.

Referring to FIG. 1, a conventional package will first be described for a better understanding of this invention. The conventional package corresponds to the conventional package that was described above.

The conventional package is for packaging a plurality of semiconductor devices or chips 30 and comprises a base member 31 and a cap member 32 which is placed on the base member 31 to define a sealed space 33 in cooperation with the base member 31. The semiconductor devices 30 are in the sealed space 33. Particular ones of the semiconductor devices 30 are fixed to the base member 31. Specific ones of the semiconductor devices 30 are fixed to the cap member 32.

In the package, the base member 31 comprises a metal plate 34, an insulator layer 35 extending along the metal plate 34, and a plurality of conductive patterns 36 each extending along the insulator layer 35. The metal plate 34 comprises a central plate portion 37 and a plurality of peripheral plate portions 38 each extending outwardly from the central plate portion 37. Together with the insulator layer 35 and each of the conductive patterns 36, each of the peripheral plate portions 38 is folded downwardly to have a flat surface 39 extending substantially smooth and even. As a result, each of the conductive patterns 36 has a flat portion which extends substantially flat on the flat surface 39 of each of the peripheral plate portions 38.

Figure 2:
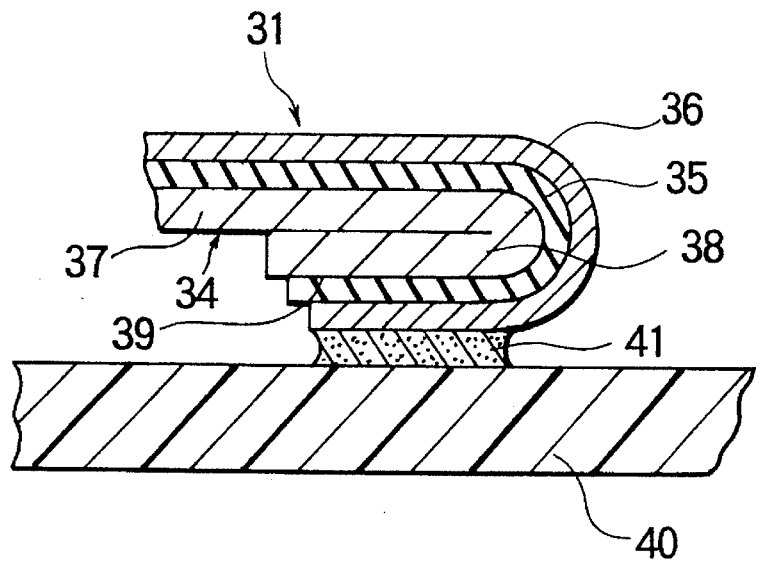
FIG. 2 is an enlarged sectional view of a part of the conventional package together with a circuit board connected to the conventional package by the use of solder.

Referring to FIG. 2, each of the conductive patterns 36 is connected to a circuit board 40 which is included in an electronic unit or system in a manner known in the art. In the case, base member 31 is placed on the circuit board 40 so that the flat surface 39 faces an upper or principal surface of the circuit board 40. Under this condition, solder is applied between each of the conductive patterns 36 and the circuit board 40. As a result, each of the conductive patterns 36 is electrically and mechanically connected to the circuit board 40 through solder 41 which is conductive.

Figure 3:
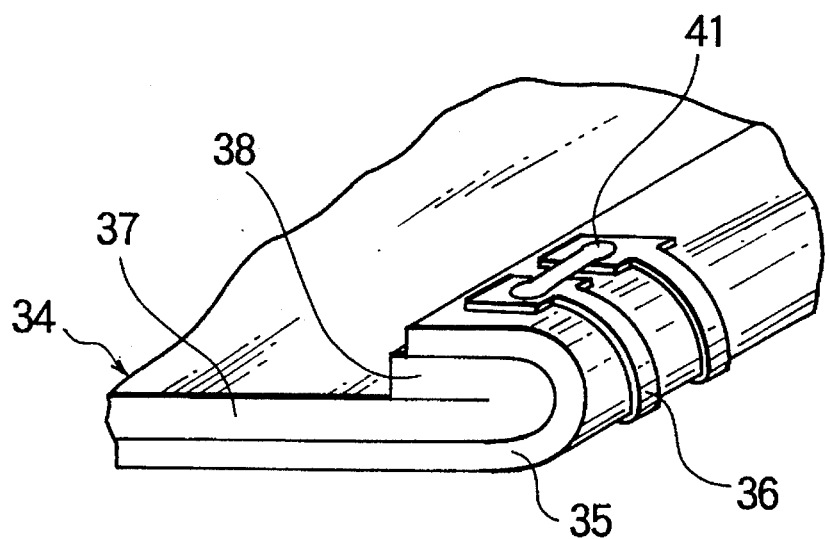
FIG. 3 shows a perspective view of a part of the conventional package together with the solder.

During soldering, the solder 41 can extend along the principal surface of the circuit board 40 to form a short circuit between adjacent ones of the conductive patterns 36 as illustrated in FIG. 3. In addition, the solder 41 can connect the conductive patterns 36 with the peripheral plate portions 38 of the metal plate 34.

Returning to FIG. 1, the conductive patterns 36 are electrically connected to the particular ones of the semiconductor devices 30 through metal wires 42. In the package, the cap member 32 comprises a metal plate 44, an insulator layer 45 extending along the metal plate 44, and a plurality of conductive patterns 46 each extending along the insulator layer 45. The metal plate 44 comprises a central plate portion 47 and a plurality of peripheral plate portions 48 each extending outwardly from the central plate portion 47. Together with the insulator layer 45 and each of the conductive patterns 46, each of the peripheral plate portions 48 is bent outwardly to have a flat surface 49 extending substantially smooth and even. As a result, each of the conductive patterns 46 has a flat portion which extends substantially flat on the flat surface 49 of each of the peripheral plate portions 48. The conductive patterns 46 are electrically connected to the specific ones of the semiconductor devices 30 through metal wires 51.

The cap member 32 is placed on the base member 31 so that the flat surface 49 faces the insulator layer 35 and the conductive patterns 36 of the base member 31. Under this condition, solder is applied between each of the conductive patterns 36 of the base member 31 and each of the conductive patterns 46 of the cap member 32. As a result, the conductive patterns 36 of the base member 31 are electrically and mechanically connected to the conductive patterns 46 of the cap member 32 through the solder 52 which is conductive. Reference numeral 53 is a sealing member for sealing between the base and the cap members 31 and 32.

During soldering, the solder 52 can extend along the insulator 35 of the base member 31 to form a short circuit between adjacent ones of the conductive patterns 36 and 46. In addition, the solder 52 can connect the conductive patterns 46 with the peripheral plate portions 48 of the metal plate 44.

Figure 4:
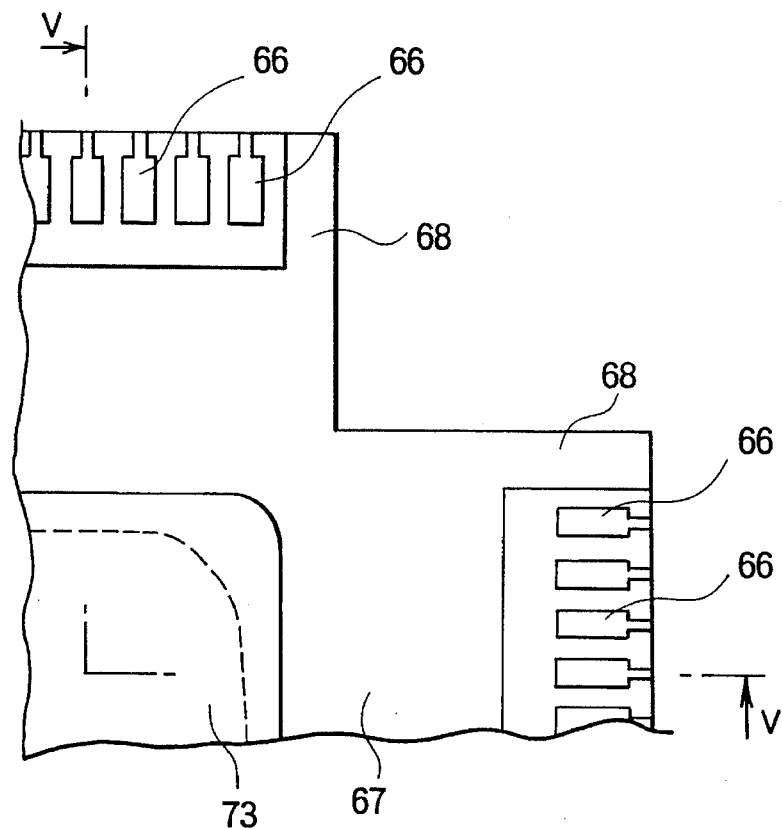
FIG. 4 is a partial bottom view of a package according to a first embodiment of this invention, wherein a semiconductor device or chip is packaged in the package.
Figure 5:
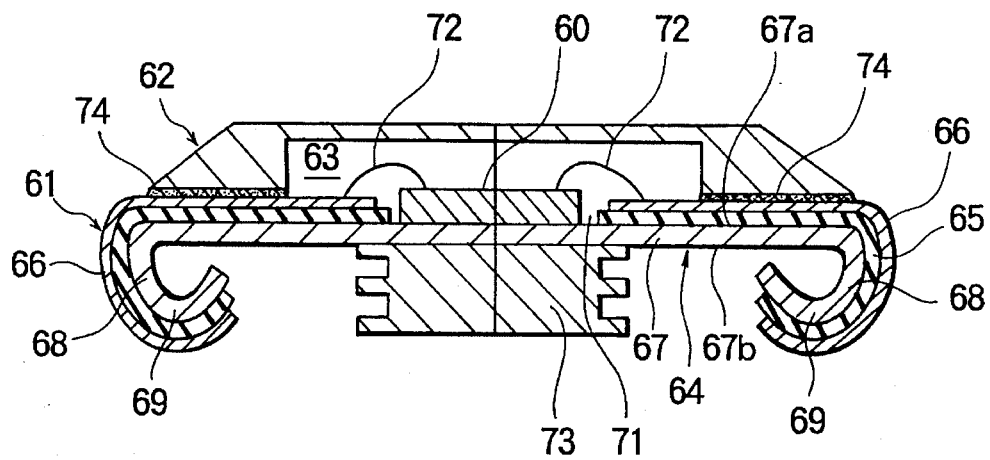
FIG. 5 is a sectional view taken along a line V—V in FIG. 4.
Figure 6:
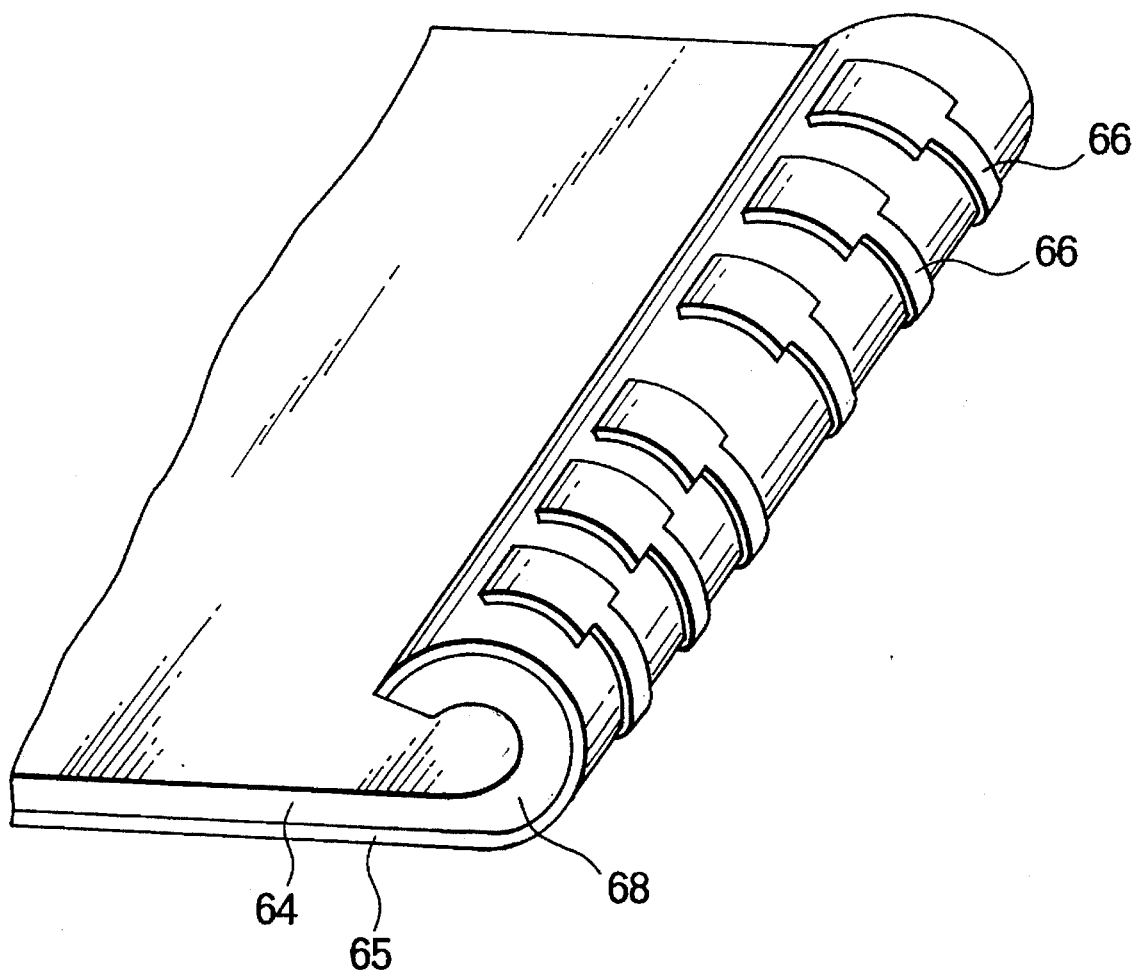
FIG. 6 is a perspective view of a part of the package illustrated in FIGS. 4 and 5.

Turning to FIGS. 4, 5, and 6, a package according to a first embodiment of this invention will be described. The package is for packaging a semiconductor device or chip 60 and comprises a base member 61 and a cap member 62 which is placed on the base member 61 to define a sealed space 63 in cooperation with the base member 61. The semiconductor device 60 is fixed to the base member 61 in the sealed space 63.

In the package, the base member 61 comprises a metal plate 64, an insulator layer 65 formed on the metal plate 64, and a plurality of conductive patterns 66 each of which is formed on the insulator layer 65. The metal plate 64 comprises a central plate portion 67 of a square shape and four peripheral plate portions 68 each extending outwardly from the central plate portion 67. Together with the insulator layer 65 and the conductive patterns 66, each of the peripheral plate portions 68 is bent downwardly and inwardly in a manner which will presently become clear.

The central plate portion 67 has an upper or a first surface 67a for mounting the semiconductor device 60 and a lower or a second surface 67b opposite to the first surface 76a in a predetermined direction. Each of the peripheral plate portions 68 is bent to face the second surface 67b of the central plate portion 67 and extends substantially along a reference plane which is perpendicular to the predetermined direction. Each of the peripheral plate portions 68 is curved so that an extending end thereof approaches the second surface 67b of the central plate portion 67. In other words, each of the peripheral plate portions 68 is curved to make a letter "V" or "U" or "C" of the alphabet in section. As a result, the peripheral plate portions 68 have particular portions 69 which project as projections from the reference plane opposite the central plate portion 67 and are on a common plane parallel to the reference plane. Adjacent ones of the particular portions 69 extend along the reference surface to make a right angle therebetween.

The insulator layer 65 is formed to have a cavity area 71 which faces the first surface 67a of the central plate portion 67 and communicates with the sealed space 63. The semiconductor device 60 is placed in the cavity area 71 and fixed to the central plate portion 67 of the metal plate 64 by a plastic material. The insulator layer 65 extends along the metal plate 64 from the first surface 67a of the central plate portion 67 to the peripheral plate portions 68 to cover the particular portions 69. The conductive patterns 66 extend along the insulator layer 65 from the central plate portion 67 to terminate at different positions of each of the particular portions 69 and are electrically connected to the semiconductor device 60 through metal wires 72. When supplied with electric energy through the metal wires 72, the semiconductor device 60 generates heat in a manner known in the art. A heat sink 73 is fixed to the second surface 67b for radiating the heat. The cap member 62 is of metal and is adhered to the insulator layer 65 through the conductive patterns 66 by adhesive material 74.

In the package, the metal plate 64 is made of one of Cu and Al. The insulator layer 65 is made of polyimide. Each of the conductive patterns 66 is made of Cu.

Figure 7:
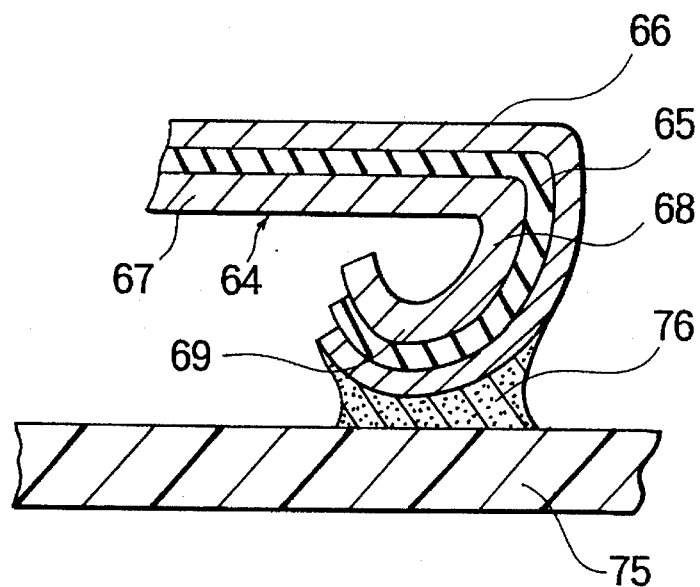
FIG. 7 is an enlarged sectional view of a part of the package illustrated in FIGS. 4 and 5, wherein the package is connected to a circuit board by solder.

Turning to FIG. 7 together with FIG. 4, a description will be given of a case where each of the conductive patterns 66 is connected to a circuit board 75 which is included in an electronic unit or system in the manner known in the art. In the case, the base member 61 is placed on the circuit board 75 in a manner known in the art. Under this condition, solder is applied between each of the conductive patterns 66 and the circuit board 75. As a result, each of the conductive patterns 66 is electrically and mechanically connected to the circuit board 75 through solder 76 which is conductive.

Figure 8:
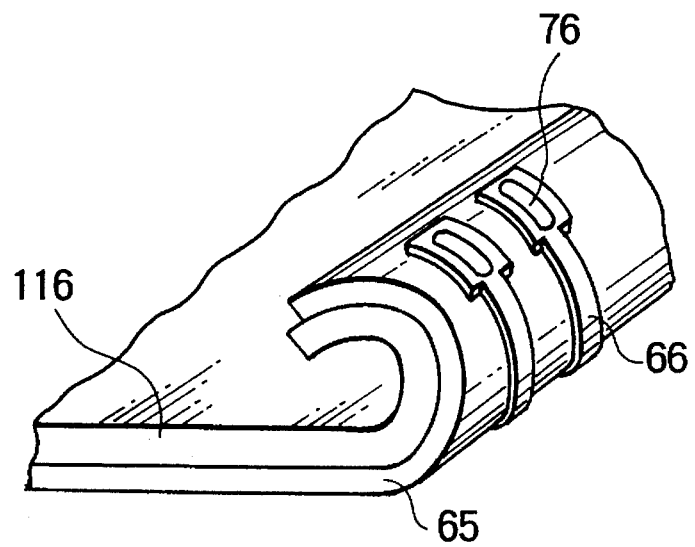
FIG. 8 shows, together with the solder, a perspective view of a part of the package illustrated in FIGS. 4 and 5.

After soldering, the solder 76 is only on each of the conductive patterns 66 as illustrated in FIG. 8. In other words, the solder 76 does not form the above-mentioned short circuit between adjacent ones of the conductive patterns 66 even when the solder 76 has a redundant portion known in the art. This is because the redundant portion of the solder 76 extends along each of the conductive patterns 66 due to surface tension thereof without protruding from each of the conductive patterns 66.

Turning to FIGS. 9A-9E, a description will be given of a method of manufacturing the package that is described with reference to FIGS. 4-6. For simplification of the drawings, the number of the conductive patterns 66 and the shape of each has been modified.

Figure 9A:
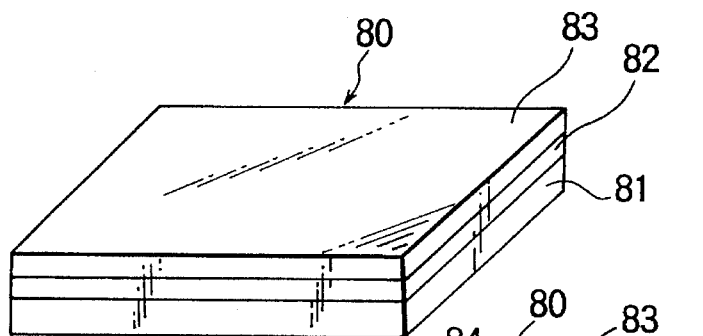
FIGS. 9A–9E are views for describing a method of manufacturing a package modified from the package illustrated in FIGS. 4–8.

At a first step of the method, a sheet member 80 is prepared with a square shape. As shown in FIG. 9A, the sheet member 80 comprises a metal plate member 81 having a first and a second surface which are opposite to each other in the predetermined direction, an insulator layer 82 covering the first surface of the metal plate member 81, and a conductive film 83 placed on the insulator layer 82. The metal plate member 81 is made of one of Cu and Al and has a thickness of 0.2 mm. The insulator layer 82 is made of polyimide and has a thickness of 0.02 mm. The conductive film 83 is made of Cu.

Figure 9B:
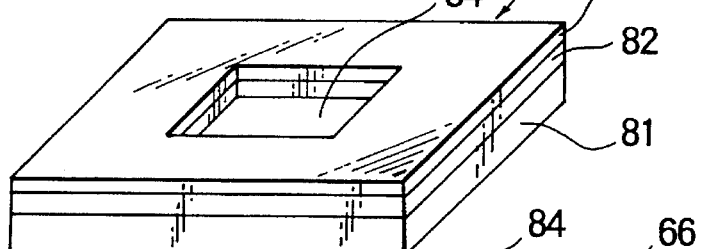

At a second step, etching is applied to only the conductive plate member 81 and the insulator layer 82 to partially delete them as illustrated in FIG. 9B. As a result, the sheet member 80 has a recessed portion 84 at a central portion thereof. The recessed portion 84 makes the metal plate member 81 be exposed therethrough.

Figure 9C:
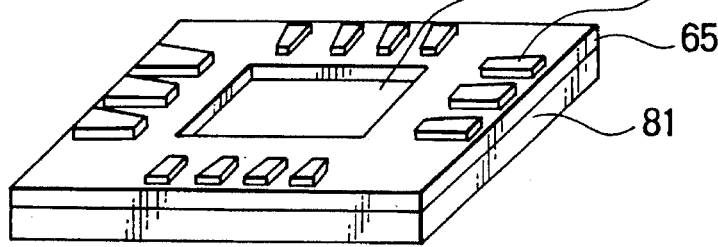

At a third step, etching or patterning is carried out as regards only the conductive film 83 to form the conductive patterns 66 on the insulator layer 65 as schematically illustrated in FIG. 9C. It is to be noted that the combination of the metal plate member 81 and the insulator layer 82 has four corner portions at each of which the conductive patterns 66 is not formed. The conductive patterns 66 terminate at a point of 0.5 mm from an edge portion of the metal plate 81. Next, Ni and Au are deposited on a bottom of the recessed portion 84 and on the conductive patterns 66 resulting in a thickness of 5–6 μm and a thickness of 0.05–0.10 μm, respectively.

Figure 9D:
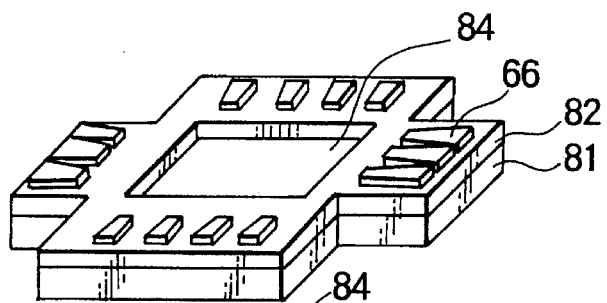

At a fourth step, the metal plate member 81 and the insulator layer 82 are removed with each of the corner portions as illustrated in FIG. 9D. This results in the above-mentioned metal plate 64 having the central plate portion and the peripheral plate portions.

Figure 9E:
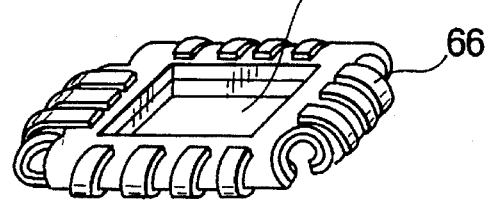

At a fifth step, each of the peripheral plate portions is bent or curved as illustrated in FIG. 9E so that the second surface has portions facing each other. The peripheral plate portions extend substantially along the above-mentioned reference plane while each of the peripheral plate portions has the above-mentioned particular portion that projects from the reference plane opposite the central plate portion.

Figure 10:
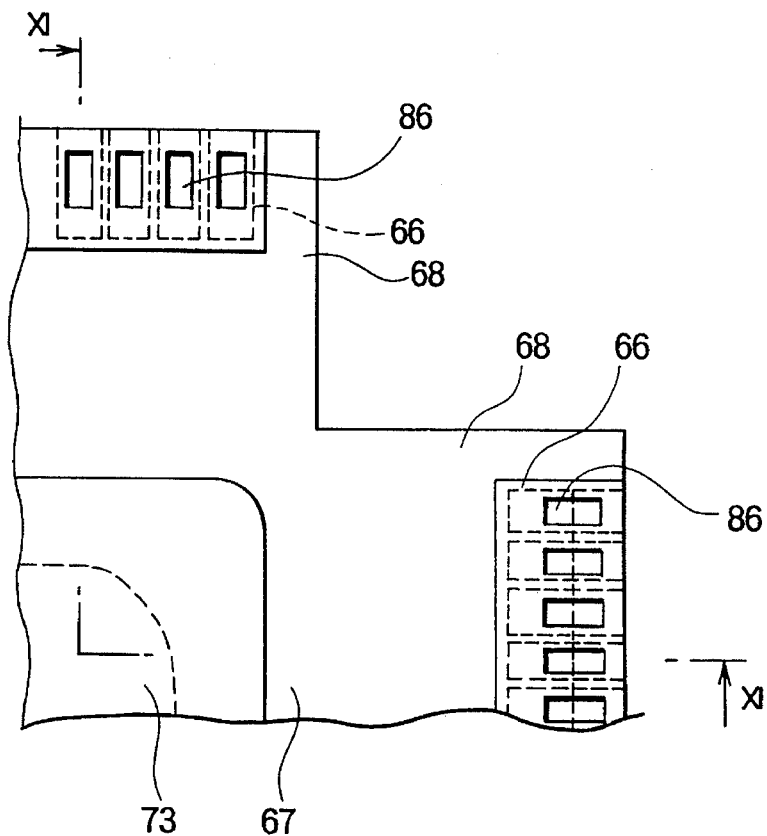
FIG. 10 is a partial bottom view of a package according to a second embodiment of this invention, wherein a semiconductor device or chip is packaged in the package.
Figure 11:
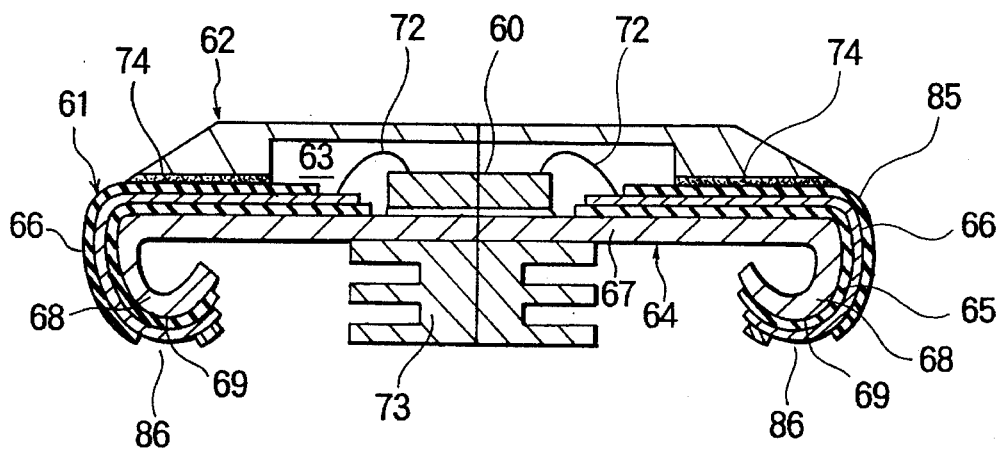
FIG. 11 is a sectional view taken along a line XI—XI in FIG. 10.

Turning to FIGS. 10 and 11, a package according to a second embodiment of this invention will be described. Similar parts are designated by like reference numerals.

The package further comprises an additional insulator layer 85 which is formed on the insulator layer 65. The additional insulator layer 85 extends from the central plate portion 67 to the peripheral plate portions 68 to cover the conductive patterns 66.

The additional insulator layer 85 has a plurality of openings 86 which are arranged along each of the particular portions 69 that extends along the reference surface. Each of the openings 86 makes each of the conductive patterns 66 have a connecting portion which is exposed therethrough and is for being connected to the above-mentioned circuit board by soldering. Each of the openings 86 will be referred to as an exposure making portion.

Figure 12:
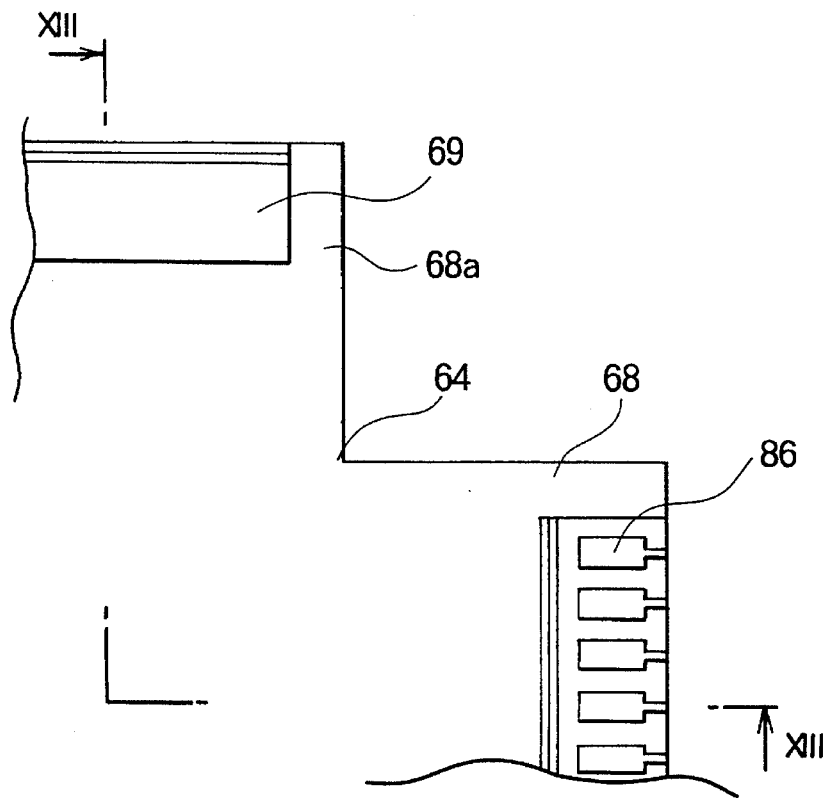
FIG. 12 is a partial bottom view of a package according to a third embodiment of this invention, wherein a semiconductor device or chip is packaged in the package.
Figure 13:
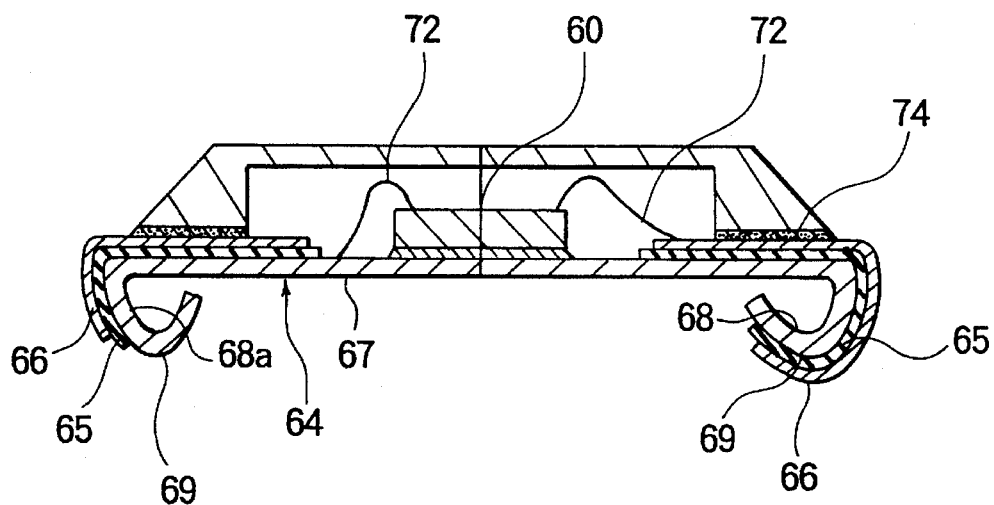
FIG. 13 is a sectional view taken along a line XIII—XIII in FIG. 12.

Turning to FIGS. 12 and 13, a package according to a third embodiment of this invention will be described. The package comprises similar parts designated by like reference numerals.

In the package, one of the peripheral plate portions 68 of the metal plate 64 will be called herein a supplementary peripheral plate portion and is designated by a reference numeral 68a. In the supplementary peripheral plate portion 68a, the particular portion 69 is exposed with the insulator layer 65 and the conductive patterns 66 being removed therefrom. In other words, the insulator layer 65 extends from the central plate portion 67 to the supplementary peripheral plate portion 68a without covering the particular portion 69 of the supplementary peripheral plate portion 68a. The central plate portion 67 of the metal plate 64 is electrically connected to the semiconductor device 30 through one of the metal wires 72.

With this structure, it is possible to electrically connect the semiconductor device 30 with the ground through the metal plate 64. In other words, the supplementary peripheral plate portion 68a can be used as a ground connecting portion known in the art.

Figure 14:
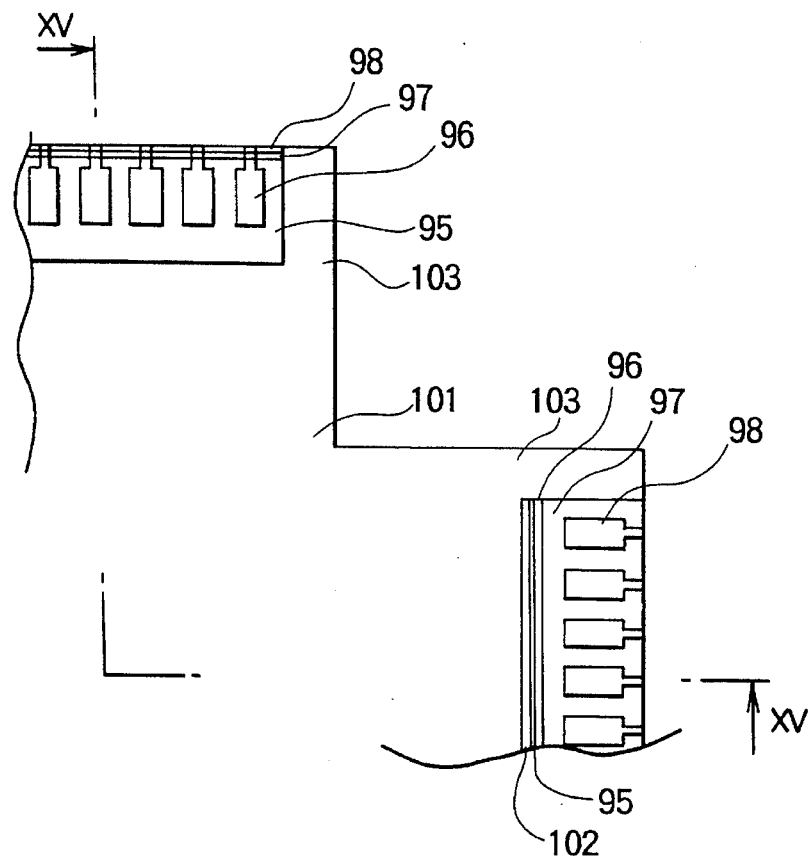
FIG. 14 is a partial bottom view of a package according to a fourth embodiment of this invention, wherein a semiconductor device or chip is packaged in the package.
Figure 15:
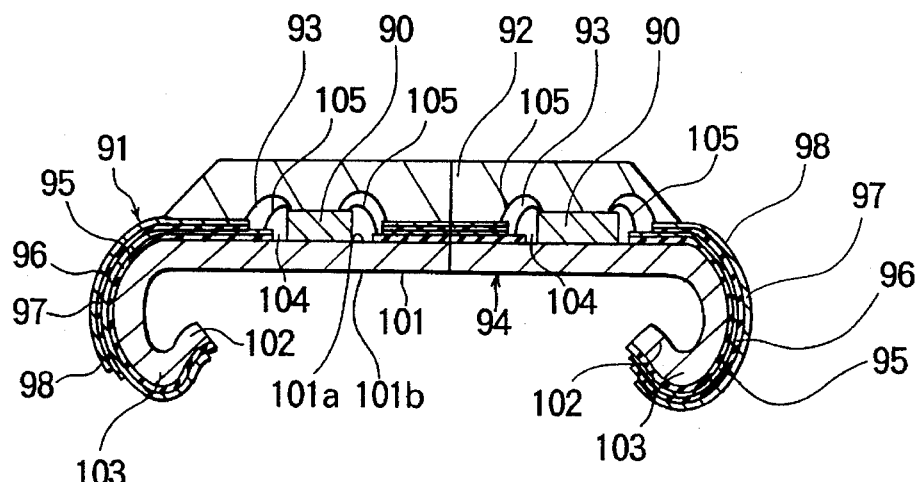
FIG. 15 is a sectional view taken along a line XV—XV in FIG. 14.

Turning to FIGS. 14 and 15, a package according to a fourth embodiment of this invention will be described. The package is for packaging a plurality of semiconductor devices or chips 90 and comprises a base member 91 and a cap member 92 which is placed on the base member 91 to define a sealed space 93 in cooperation with the base member 91. The semiconductor devices 90 are fixed to the base member 91 in the sealed space 93.

In the package, the base member 91 comprises a metal plate 94, a main insulator layer 95 formed on the metal plate 94, a plurality of main conductive patterns 96 each of which is formed on the main insulator layer 95, a supplementary insulator layer 97 formed on the main insulator layer 95 to cover the main conductive patterns 96, and a plurality of supplementary conductive patterns 98 each of which is formed on the supplementary insulator layer 97. The metal plate 94 comprises a central plate portion 101 of a square shape and four peripheral plate portions 102 each extending outwardly from the central plate portion 101. Together with the main and the supplementary insulator layers 95 and 97 and the main and the supplementary conductive patterns 96 and 98, each of the peripheral plate portions 102 is bent downwardly and inwardly in the manner which will presently become clear.

The central plate portion 101 has an upper or a first surface 101a for mounting the semiconductor devices 90 and a lower or a second surface 101b opposite to the first surface 101a in a predetermined direction. Each of the peripheral plate portions 102 is bent to face the second surface 101b of the central plate portion 101 and extends substantially along a reference plane which is perpendicular to the predetermined direction. Each of the peripheral plate portions 102 is curved so that an extending end thereof approaches the second surface 101b of the central plate portion 101. As a result, the peripheral plate portions 102 have particular portions 103 which project as projections from the reference plane opposite the central plate portion 101 and are on a common plane parallel to the reference plane. Adjacent ones of the particular portions 103 extend along the reference surface to make a right angle therebetween.

The main and the supplementary insulator layers 95 and 97 are formed to have a plurality of cavity areas 104 each of which faces the first surface 101a of the central plate portion 101 and communicates with the sealed space 93. The semiconductor devices 90 are placed in the cavity areas 104, respectively, and are fixed to the central plate portion 101 of the metal plate 94 by a plastic material. The main insulator layer 95 extends along the metal plate 94 from the first surface 101a of the central plate portion 101 to the peripheral plate portions 102 to cover the particular portions 103. The main conductive patterns 96 extend along the main insulator layer 95 from the central plate portion 101 to terminate at different positions of each of the particular portions 103 and are electrically connected to the semiconductor devices 90 through metal wires 105. The supplementary insulator layer 97 extends along the main insulator layer 95 from the central plate portion 101 to the peripheral plate portions 102 to cover one of opposite ones of the particular portions 103 and not to cover another one of the opposite ones of the particular portions 103. The supplementary conductive patterns 98 extend only along the supplementary insulator layer 97 from the central plate portion 101 to the peripheral plate portions 102. More particularly, the supplementary conductive patterns 98 extend to terminate at different positions over each of the particular portions 103 in a right side one of the peripheral plate portions 102 and to terminate at an end of the supplementary insulator layer 97 in a left side one of the peripheral plate portions 102. The main and the supplementary conductive patterns 96 and 98 are electrically connected to the semiconductor devices 90 through metal wires 105.

When supplied with electric energy through the metal wires 105, the semiconductor devices 90 generate heat in a manner known in the art. A heat sink 106 is fixed to the second surface 101b for radiating the heat. The cap member 92 is of metal and is adhered to the supplementary insulator layer 97 through the supplementary conductive patterns 98 by adhesive material 106.

In the package, the metal plate 94 is made of one of Cu and Al. Each of the main and the supplementary insulator layers 95 and 97 is made of polyimide. Each of the main and the supplementary conductive patterns 96 and 98 is made of Cu.

Figure 16:
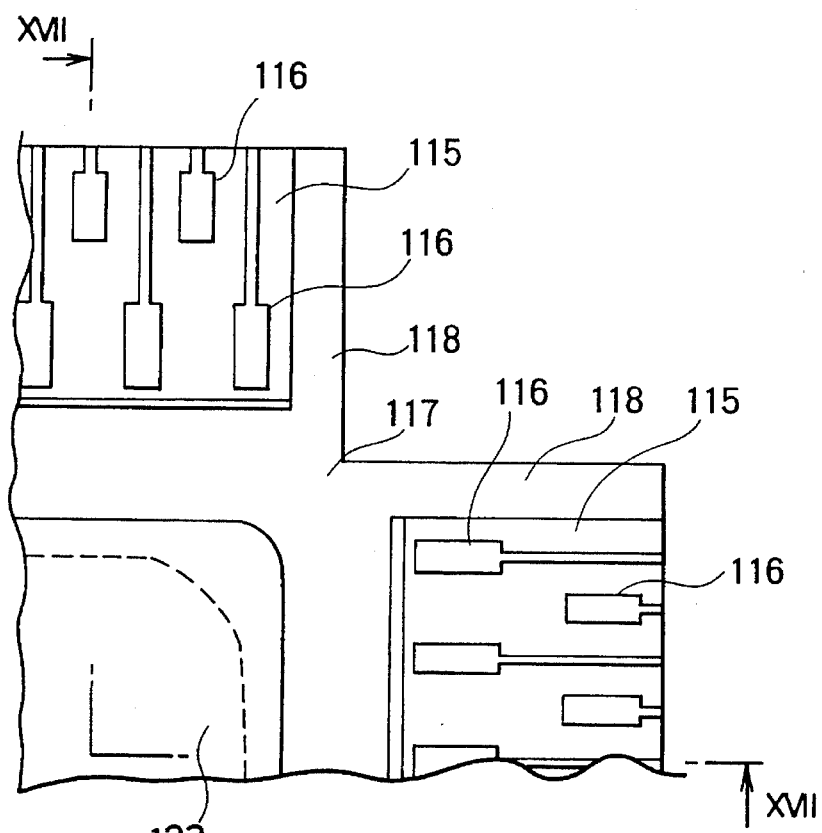
FIG. 16 is a partial bottom view of a package according to a fifth embodiment of this invention, wherein a semiconductor device or chip is packaged in the package.
Figure 17:
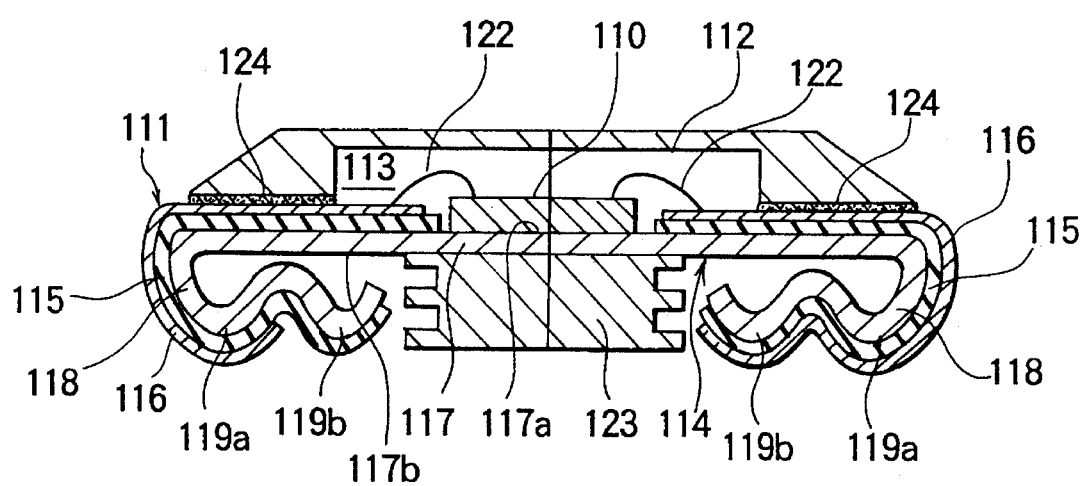
FIG. 17 is a sectional view taken along a line XVII—XVII in FIG. 16.
Figure 18:
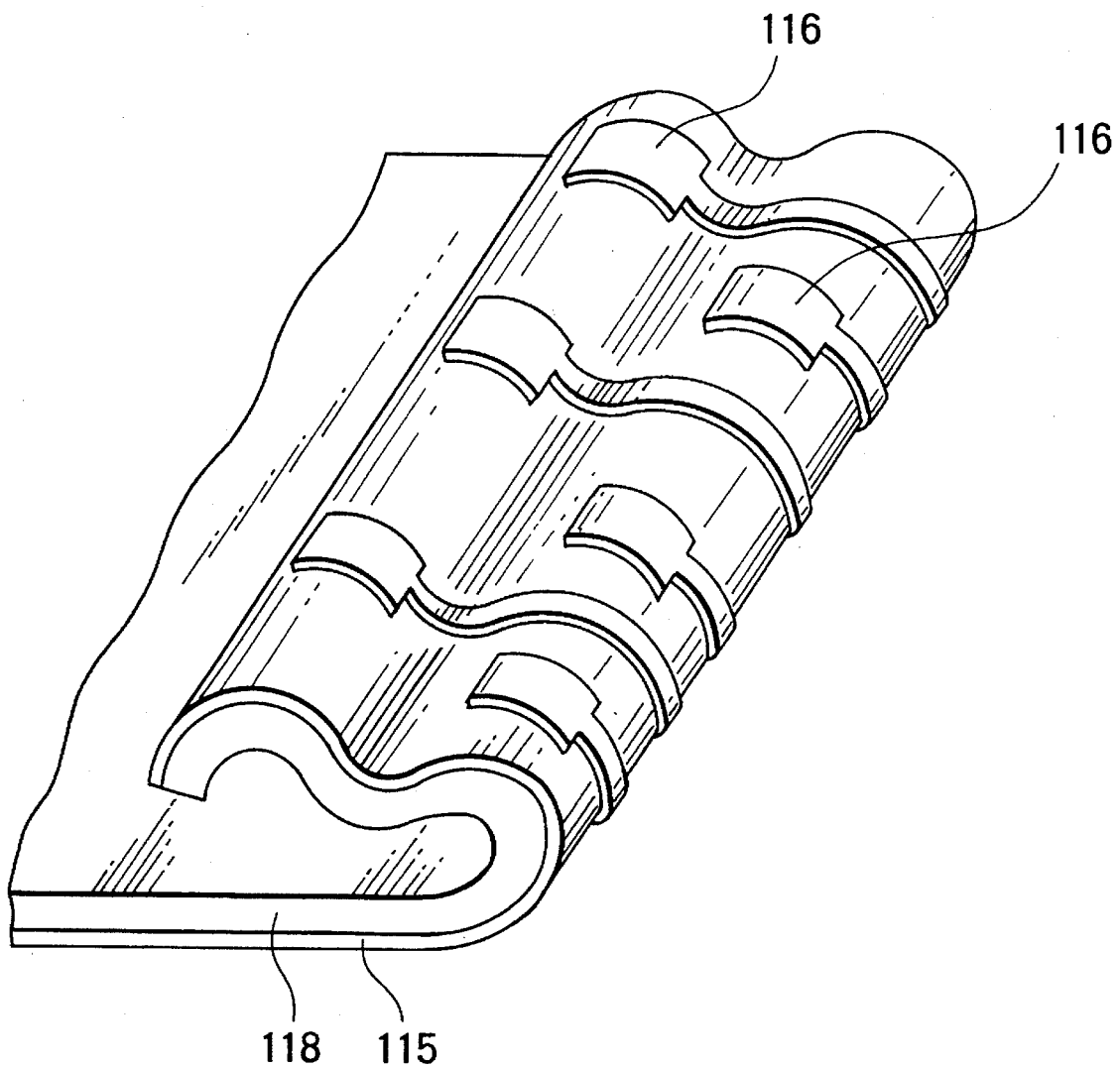
FIG. 18 is a perspective view of a part of the package illustrated in FIGS. 16 and 17.

Turning to FIGS. 16, 17, and 18, a fifth embodiment of this invention will be described. The package is for packaging a semiconductor device or chip 110 and comprises a base member 111 and a cap member 112 which is placed on the base member 111 to define a sealed space 113 in cooperation with the base member 111. The semiconductor device 110 is fixed to the base member 111 in the sealed space 113.

In the package, the base member 111 comprises a metal plate 114, an insulator layer 115 formed on the metal plate 114, and a plurality of conductive patterns 116 each of which is formed on the insulator layer 115. The metal plate 114 comprises a central plate portion 117 of a square shape and four peripheral plate portions 118 each extending outwardly from the central plate portion 117. Together with the insulator layer 115 and the conductive patterns 116, each of the peripheral plate portions 118 is bent downwardly and inwardly in a manner which will presently become clear.

The central plate portion 117 has an upper or a first surface 117a for mounting the semiconductor device 110 and a lower or a second surface 117b opposite to the first surface 117a in a predetermined direction. Each of the peripheral plate portions 118 is bent to face the second surface 117b of the central plate portion 117 and extends substantially along a reference plane which is perpendicular to the predetermined direction. Each of the peripheral plate portions 118 is curved to make a letter "W" of the alphabet in section. In other words, each of the peripheral plate portions 118 extends to have an end portion and an intermediate portion which approach the second surface 117b of the central plate portion 117. As a result, each of the peripheral plate portions 118 has a particular and a specific portion 119a and 119b which project as projections from the reference plane opposite the central plate portion 117. The particular and the specific portions 119a and 119b extend parallel to each other on a common plane which is parallel to the reference plane.

The insulator layer 115 is formed to have a cavity area 121 which faces the first surface 117a of the central plate portion 117 and communicates with the sealed space 113. The semiconductor device 110 is placed in the cavity area 121 and fixed to the central plate portion 117 of the metal plate 114 by a plastic material.

The insulator layer 115 extends along the metal plate 114 from the first surface 117a of the central plate portion 117 to the peripheral plate portions 118 to cover the particular portion 119a. The conductive patterns 116 extend along the insulator layer 115 from the central plate portion 117 to the peripheral plate portions 118. One of adjacent ones of the conductive patterns 116 extends over different positions of the particular portion 119a to terminate at the intermediate portion of each of the peripheral plate portions 118. Another of the adjacent conductive patterns 116 extends over the particular portion 119a and over different positions of the specific portion 119b to terminate at the end portion of each of the peripheral plate portions 118.

The conductive patterns 116 are electrically connected to the semiconductor device 110 through metal wires 122. When supplied with electric energy through the metal wires 122, the semiconductor device 110 generates heat in the manner known in the art. A heat sink 123 is fixed to the second surface 117b for radiating the heat. The cap member 112 is of metal and is adhered to the insulator layer 115 through the conductive patterns 116 by adhesive material 124.

The metal plate 114 is made of one of Cu and Al. The insulator layer 115 is made of polyimide. Each of the conductive patterns 116 is made of Cu.

Figure 19:
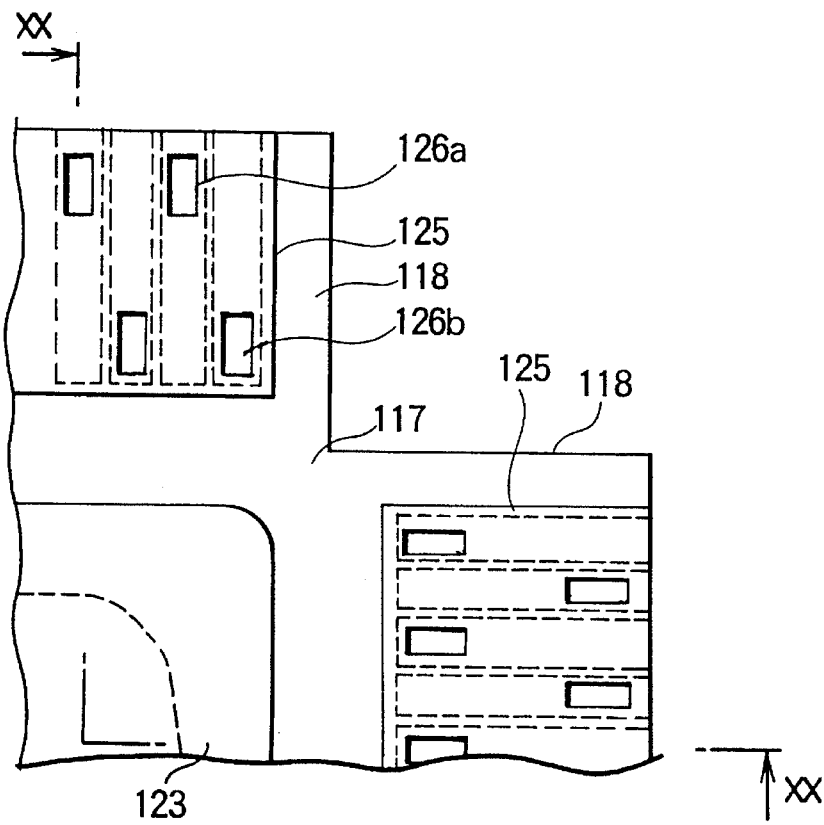
FIG. 19 is a partial bottom view of a package according to a sixth embodiment of this invention, wherein a semiconductor device or chip is packaged in the package.
Figure 20:
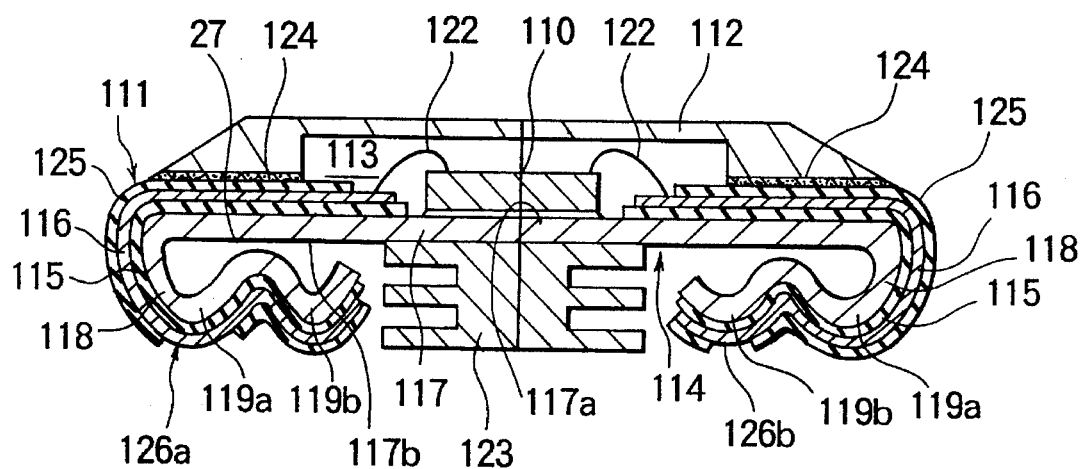
FIG. 20 is a sectional view taken along a line XX—XX in FIG. 19.

Turning to FIGS. 19 and 20, a sixth embodiment of this invention will be described. Similar parts are designated by like reference numerals. In the package, it is to be noted that all of the conductive patterns 116 extend over the particular portion 119a and over different positions of the specific portion 119b to terminate at the end portion of each of the peripheral plate portions 118.

In the package, the base member 111 further comprises an additional insulator layer 125 formed on the first-mentioned insulator layer 115. The additional insulator layer 125 extends from the central plate portion 117 to the peripheral plate portions 118 to cover the conductive patterns 116 extending parallel to one another.

In connection with each of the peripheral plate portions 118, the additional insulator layer 125 has a plurality of particular openings 126a and a plurality of specific openings 126b. The particular openings 126a are arranged along the particular portion 119a to face the conductive patterns 116 every other pattern so that one of adjacent ones of the conductive patterns 116 is exposed as one of connecting portions through each of the particular openings 126a. On the other hand, the specific openings 126b are arranged along the specific portion 119b to face the conductive patterns 116 every other pattern so that another of the adjacent conductive patterns 116 is exposed as another one of the connecting portions through each of the specific openings 126b. The connecting portions are connected to the above-mentioned circuit board by soldering. Each of the particular and the specific openings 126a and 126b will be referred to as the exposure making portion.

Figure 21:
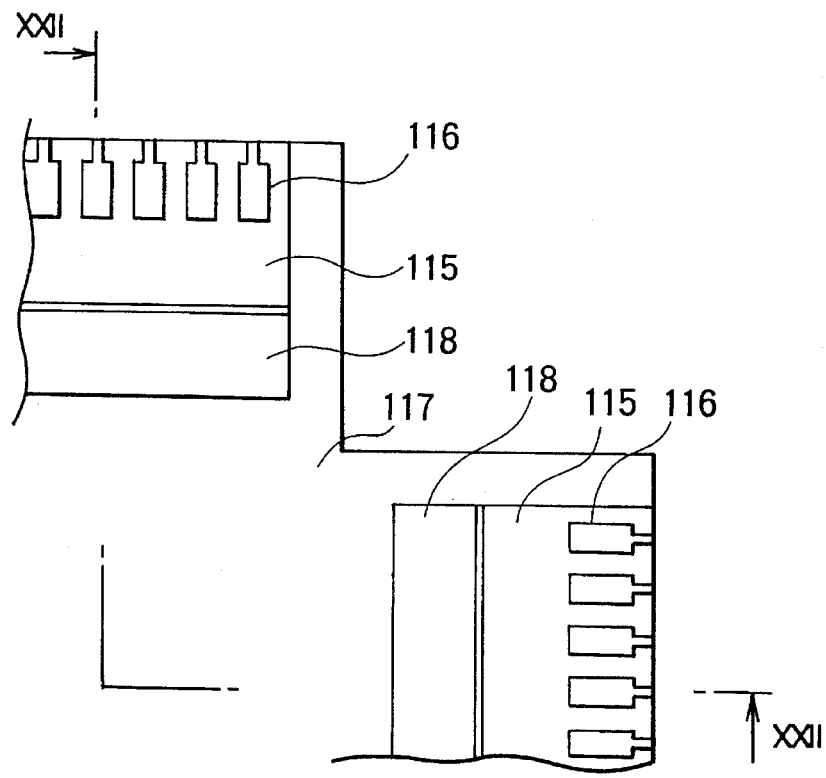
FIG. 21 is a partial bottom view of a package according to a seventh embodiment of this invention, wherein a semiconductor device or chip is packaged in the package.
Figure 22:
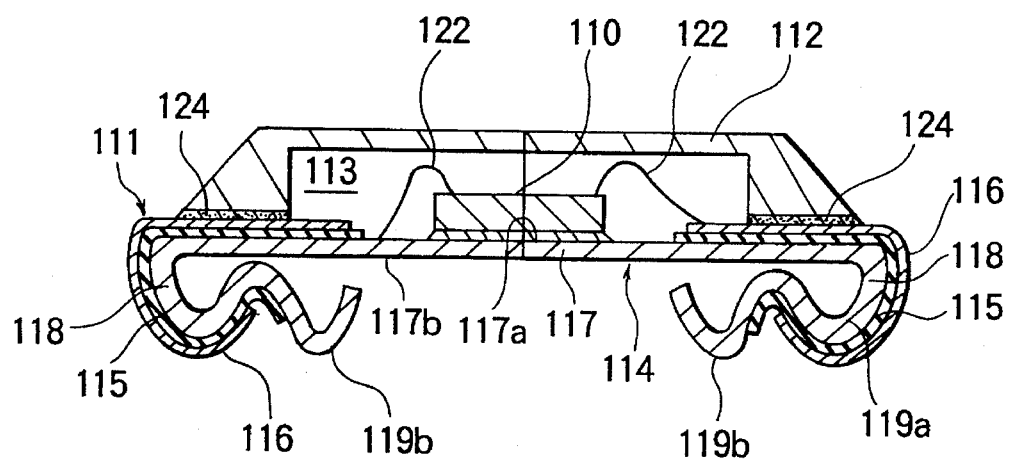
FIG. 22 is a sectional view taken along a line XXII—XXII in FIG. 21.

Turning to FIGS. 21 and 22, a seventh embodiment of this invention will be described. The package comprises similar parts designated by like reference numerals.

In the package, the insulator layer 115 extends over the particular portion 119a to terminate at the intermediate portion of each of the peripheral plate portions 118. As a result, the particular portion is covered by the insulator layer while the specific portion 119b is exposed in each of the peripheral plate portions 118 without being covered by the insulator layer 115. The conductive patterns 116 extend along the insulator layer 115 to terminate at the intermediate portion of each of the peripheral plate portions 118.

The central plate portion 117 of the metal plate 114 is electrically connected to the semiconductor device 110 through one of the metal wires 122.

With this structure, it is possible to electrically connect the semiconductor device 110 with the ground through the metal plate 114. In other words, the specific portion 119b can be used as the ground connection portion.

Figure 23:
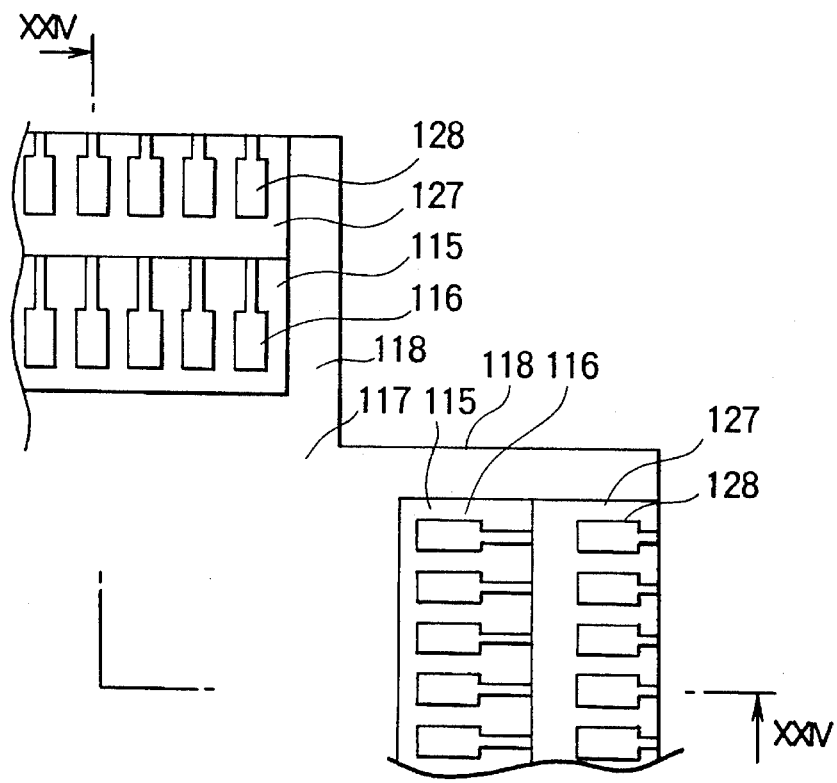
FIG. 23 is a partial bottom view of a package according to an eighth embodiment of this invention, wherein a semiconductor device or chip is packaged in the package.
Figure 24:
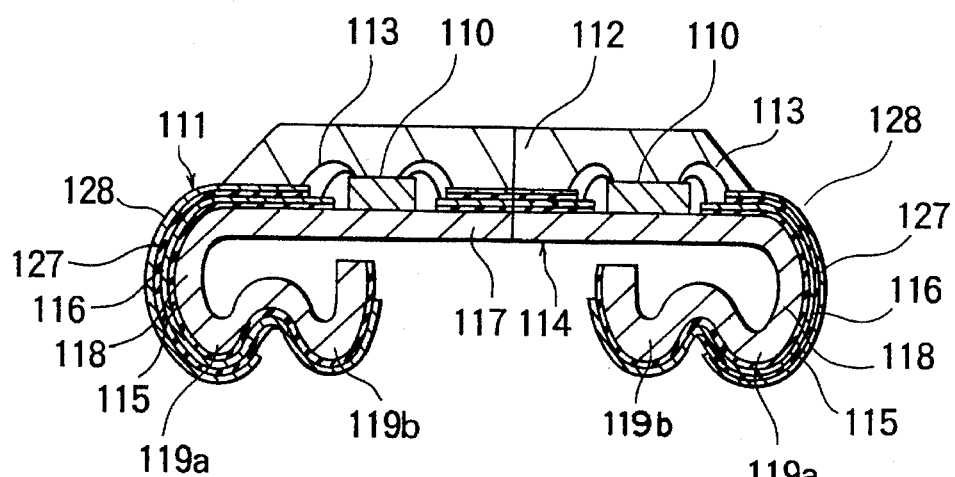
FIG. 24 is a sectional view taken along a line XXIV—XXIV in FIG. 23.

Turning to FIGS. 23 and 24, an eighth embodiment of this invention will be described. The package comprises similar parts designated by like reference numerals.

In the package, the insulator layer 115 extends over the particular and the specific portions 119a and 119b to terminate at the end portion of each of the peripheral plate portions 118. The conductive patterns 116 extend along the insulator layer 115 to cover the particular and the specific portions 119a and 119b to terminate at the vicinity of the end portion of each of the peripheral plate portions 118.

In the package, the base member 111 further comprises a supplementary insulator layer 127 formed on the first-mentioned insulator layer 115 and a plurality of supplementary conductive patterns 128 formed on the supplementary insulator layer 127. The supplementary insulator layer 127 extends from the central plate portion 117 to the peripheral plate portions 118 to cover the conductive patterns 116. The supplementary insulator layer 127 terminates at the intermediate portion of each of the peripheral plate portions 118. As a result, the first-mentioned conductive patterns 128 are exposed at the specific portion 119b.

The supplementary conductive patterns 128 extend along the supplementary insulator layer 127 from the central plate portion 117 to the peripheral plate portions 118. The supplementary conductive patterns 128 terminate at the intermediate portion of each of the peripheral plate portions 118.

What is claimed is:

1. A package for packaging a semiconductor device, comprising:
   a metal plate including a central plate portion and a peripheral plate portion extending outwardly from said central plate portion, said central plate portion having a first surface for mounting said semiconductor device and a second surface opposite to said first surface in a predetermined direction, said peripheral plate portion being bent to face said second surface of the central plate portion and extending substantially along a reference plane which is perpendicular to said predetermined direction, said peripheral plate portion having a particular portion projecting from said reference plane opposite said central plate portion;
   an insulator layer extending along said metal plate from said first surface of the central plate portion to said peripheral plate portion to cover said particular portion; and
   a conductive pattern extending along said insulator layer from said central plate portion to said particular portion.

2. A package as claimed in claim 1, wherein said particular portion extends along said reference plane, said package comprising an additional conductive pattern, said conductive pattern and said additional conductive pattern each terminating at different positions of said particular portion.

3. A package as claimed in claim 1, further comprising an additional insulator layer which is formed on said insulator layer to cover said conductive pattern and has an exposure making portion for making said conductive pattern be exposed at said particular portion.

4. A package as claimed in claim 1, wherein said metal plate further comprises a supplementary peripheral plate portion outwardly extending from said central plate portion, said supplementary peripheral plate portion being bent to face said second surface of the central plate portion and extending substantially along said reference plane, said supplementary peripheral plate portion having a supplementary particular portion projecting from said reference plane opposite said central plate portion.

5. A package as claimed in claim 4, wherein said insulator layer further extends from said central plate portion to said supplementary peripheral plate portion without covering said supplementary particular portion.

6. A package as claimed in claim 4, wherein said insulator layer further extends from said central plate portion to said supplementary peripheral plate portion to cover said supplementary particular portion, said package further comprising a supplementary conductive pattern which extends along said insulator layer from said central plate portion to said supplementary particular portion.

7. A package as claimed in claim 6, further comprising:
   an additional insulator layer formed on insulator layer to cover said supplementary conductive pattern; and
   an additional conductive pattern extending along said additional insulator layer from said central plate portion to said supplementary particular portion.

8. A package as claimed in claim 1, wherein said peripheral plate portion further has a specific portion projecting from said reference surface opposite said central plate portion, said insulator layer further covering said specific portion, said package further comprising a specific conductive pattern extending along said insulator layer from said central plate portion to said specific portion.

9. A package as claimed in claim 8, wherein said particular and said specific portions extend parallel to each other in a first direction which is perpendicular to said predetermined direction, said conductive pattern and said specific conductive pattern extend parallel to each other in a second direction which is perpendicular to said predetermined and said first directions, said conductive pattern terminating at said particular portion, and said specific conductive pattern extending over said particular portion and terminating at said specific portion.

10. A package as claimed in claim 1, further comprising a cap member fixed on said insulator layer to form a sealed space in cooperation with said central plate portion therebetween, said sealed space being for containing said semiconductor device therein.

11. A package as claimed in claim 1, further comprising a heat sink member connected to said second surface of the central plate portion.

12. A package for packaging a semiconductor device, comprising:
   a metal plate including a central plate portion and four peripheral plate portions extending outwardly from said central plate portion, said central plate portion having a first surface for mounting said semiconductor device and a second surface opposite to said first surface in a predetermined direction, each of said peripheral plate portions being bent to face said second surface of the central plate portion and extending substantially along a reference plane which is perpendicular to said predetermined direction, said peripheral plate portions having a plurality of particular portions projecting from said reference plane opposite said central plate portion;
   an insulator layer extending along said metal plate from said first surface of the central plate portion to said peripheral plate portions to cover said particular portions; and
   a plurality of conductive patterns extending along said insulator layer from said central plate portion to said particular portions.

13. A package as claimed in claim 12, wherein said peripheral plate portions further comprise a plurality of specific portions projecting from said reference plane opposite said central plane, said insulator layer further covering said specific portions, said package further comprising a plurality of specific conductive patterns extending along said insulator layer from said central plate portion to said specific portions.

14. A package as claimed in claim 13, wherein adjacent ones of said particular portions extend to make a right angle therebetween, said specific portions extending parallel to said particular portions, respectively, said particular conductive patterns terminating at said particular portions, said specific conductive patterns extending over said particular portions and terminating at said specific portions.

15. In a combination of a package and a semiconductor device packaged in said package, said package comprising:
- a metal plate including a central plate portion and a peripheral plate portion extending outwardly from said central plate portion, said central plate portion having a first surface and a second surface opposite to said first surface in a predetermined direction, said peripheral plate portion being bent to face said second surface of the central plate portion and extending substantially along a reference plane which is perpendicular to said predetermined direction, said peripheral plate portion having a particular portion projecting from said reference plane opposite said central plate portion;
- an insulator layer extending along said metal plate from said first surface of the central plate portion to said peripheral plate portion to cover said particular portion;
- a conductive pattern extending along said insulator layer from said central plate portion to said particular portion; and
- a cap member fixed on said insulator layer to form a sealed space in cooperation with said central plate portion therebetween, said semiconductor device being fixed to said central plate portion in said sealed space and electrically connected to said conductive pattern.

16. A combination as claimed in claim 15, wherein said metal plate further comprises a supplementary peripheral plate portion outwardly extending from said central plate portion, said supplementary peripheral plate portion being bent to face said second surface of the central plate portion and extending substantially along said reference plane, said supplementary peripheral plate having a supplementary particular portion projecting from said reference plane opposite said central plate portion, said semiconductor device further being electrically connected to said supplementary peripheral plate portion.

17. A combination as claimed in claim 15, further comprising a heat sink member connected to said second surface of the central plate portion.

* * * * *